United States Patent [19]

Horspool et al.

[11] Patent Number: 5,442,351

[45] Date of Patent: Aug. 15, 1995

[54] DATA COMPRESSION METHOD AND APPARATUS FOR WAVEFORMS HAVING RECURRING FEATURES

[75] Inventors: Robert N. S. Horspool; Warren J. Windels, both of Victoria, Canada

[73] Assignee: Harley Street Software Ltd., Vancouver, Canada

[21] Appl. No.: 122,955

[22] Filed: Sep. 20, 1993

[51] Int. Cl.⁶ .............................................. H03M 7/30
[52] U.S. Cl. .......................................... 341/51; 341/87
[58] Field of Search ................................... 341/51, 87

[56] References Cited

U.S. PATENT DOCUMENTS

| | | | |
|---|---|---|---|
| 4,701,745 | 10/1987 | Waterworth | 341/63 |
| 4,920,489 | 4/1990 | Hubelbank et al. | 364/413.06 |
| 4,947,858 | 8/1990 | Smith | 128/696 |
| 5,016,009 | 5/1991 | Whiting et al. | 341/67 |
| 5,215,098 | 6/1993 | Steinhaus et al. | 128/702 |

OTHER PUBLICATIONS

Storer, *Data Compression: Methods and Theory*, copyright ©1988 Computer Science Press, Chapter 3, pp. 54-123.
Article from *IEEE Transactions on Information Theory*, vol. IT-23, No. 3, May 1977, pp. 337-343, entitled: "A Universal Algorithm for Sequential Data Compression" by Jacob Ziv and Abraham Lempel.
Article from *IEEE Transactions on Biomedical Engineering*, vol. 37, No. 4, Apr. 1990, pp. 329-340, entitled: "ECG Data Compression Techniques—A Unified Approach" by Sateh M. S. Jalaleddine, Chriswell G. Hutchens, Robert D. Strattan and William A. Coberly.
Article from *IEEE Transactions on Biomedical Engineering*, vol. BME-29, No. 1, Jan. 1982, pp. 43-48, entitled: "A New Data-Reduction Algorithm for Real-Time ECG Analysis" by John P. Abenstein and Willis J. Tompkins.
Article from *IEEE Transactions on Biomedical Engi-*

*neering*, Apr. 1968, pp. 128-129, entitled: "AZTEC, a Preprocessing Programs for Real-Time ECG Rhythm Analysis" by J. R. Cox, F. M. Nolle, H. A. Fozzard and G. C. Oliver, Jr.
Article from *IEEE Transactions on Biomedical Engineering*, vol. BME-30, No. 11, Nov. 1983, pp. 723-729, entitled: "Scan-Along Polygonal Approximation for Data Compression of Electrocardiograms" by Masa Ishijima, Soon-Bum Shin, Gene H. Hostetter and Jack Sklansky.
Article from *Biomedical Science Instrumentation*, vol. 14, (1978), pp. 81-85, entitled: "Arrhythmia Detection Program for an Ambulatory ECG Monitor" by W. C. Mueller.

*Primary Examiner*—Howard L. Williams
*Attorney, Agent, or Firm*—Bull, Housser & Tupper

[57] ABSTRACT

An apparatus and method for compressing an input sequence of data items produced by sampling a periodic waveform compresses such input sequence by searching a history buffer operable to store consecutive data items, to locate a stored sequence of consecutive data items matching the input sequence. Matching is deemed to occur when each data item in the input sequence is within non-equal upper and lower limits of its corresponding data item in the stored sequence. When a stored sequence matching the input sequence is located compressed output data is produced to represent the stored sequence and the stored sequence is again stored in the history buffer to succeed the data items already stored therein. When a stored sequence matching the input sequence is not located, a representation of the first data item in the input sequence is produced and the first data item is stored in the history buffer to succeed the data items already stored therein. In addition, there is disclosed a system employing the above compression method in combination with a decompression method.

53 Claims, 6 Drawing Sheets procedure Compress: / 150

```
1   clear both the MatchingPositions list (34) and the first HistoryBuffer (32) to empty;
2   i := 1 {set input counter (48) to 1};
3   repeat
4       E := the i-th ECG data item from the input buffer (16) the presently received
5       data sample;
6       if the MatchingPositions list (34) is empty then
7           begin
8               find all storage locations p in the first HistoryBuffer (32) where the
9               stored data item approximately matches E and create a list of all these
10              positions as the MatchingPositions list (34);
11              if the MatchingPositions list (34) is empty then
12                  begin
13                      output the single value E {ie output first data item in the input
14                      sequence};
15                      append E to the HistoryBuffer (32) {ie store E in the
16                      HistoryBuffer (32) to succeed data items already stored there};
17                  end
18              else
19                  begin
20                      FirstValue := E {set first value register (40) to E};
21                      MatchLength := 1 {set Matchlength counter (38) to 1};
22                  end
23          end
```

Fig. 2(a)

```
24      else
25         begin
26            SavedMatchingPositions (36):= a copy of the MatchingPositions list (34);
27            for each storage location p in the MatchingPositionslist (34) do
28                  if  E is not within the upper and lower limits contained in the upper and
29                        lower limit registers (42) and (44), of the data item stored at location
30                        p+MatchLength in the HistoryBuffer (32) then
31                        remove p from the MatchingPositions list (34);
32                  else
33                        {do nothing};
34            if  the MatchingPositions list (34) is now empty then
35                  if   MatchLength counter (38) < MinimumMatchLength 46 then
36                        begin
37                              output the first data item, FirstValue;
38                              append FirstValue to the HistoryBuffer (32); {ie store FirstValue
39                              in the HistoryBuffer (32) to succeed data items already stored
40                              there};
41                                    i := i - MatchLength
42                        end
43                  else
44                        begin
45                              choose one storage location p from SavedMatchingPositions list
46                              (36);
47                              output the pair (p, MatchLength) representing stored sequence;
48                              for j := each integer from 1 to MatchLength do
49                                    look up the value at position p+j-1 in the
50                                    HistoryBuffer (32) and append this value to the
51                                    HistoryBuffer (32) {store each data item in the
52                                    stored sequence in the HistoryBuffer (32)};
53                                    i := i - 1
54                        end
55            else
56                  MatchLength=MatchLength + 1 {increment MatchLength counter (38)};
57         end;
58      i := i + 1 {increment input counter (48)};
59  until there is no more input to process;
60      if the MatchingPositions list (34) is not empty then
61         begin
62            choose one storage location p from the MatchingPositions list (34);
63            output the pair (p,MatchLength) representing the stored sequence
64         end
```

Fig. 2(b)

Input (Analogue Signal):

Input (Digitized Signal)

0 1 2 5 9 15 17 18 18 19 18 17 15 11 6 3 1 0 0 0 0 1 2 4 6 8 10 12
14 16 17 18 18 16 12 8 5 3 1

| Row | i | $E_i$ | History Buffer | | | | | | | | | | | Matching Positions List | Match Length | First Value | Output |
|---|---|---|---|---|---|---|---|---|---|---|---|---|---|---|---|---|---|---|
| | | | 0 | 1 | 2 | 3 | 4 | 5 | 6 | 7 | 8 | 9 | | | | | |
| 1 | 1 | 0 | 0 | 0 | 0 | 0 | 0 | 0 | 0 | 0 | 0 | 0 | | empty | x | x | 0 |
| 2 | 2 | 1 | 0 | 0 | 0 | 0 | 0 | 0 | 0 | 0 | 0 | 0 | | 0 | 1 | 1 | |
| 3 | 3 | 2 | 0 | 0 | 0 | 0 | 0 | 0 | 0 | 0 | 0 | 0 | | empty | x | x | 1 |
| 4 | 3 | 2 | 0 | 1 | 0 | 0 | 0 | 0 | 0 | 0 | 0 | 0 | | 0 1 | 1 | 2 | |
| 5 | 4 | 5 | 0 | 1 | 0 | 0 | 0 | 0 | 0 | 0 | 0 | 0 | | empty | x | x | 2 |
| 6 | 4 | 5 | 0 | 1 | 2 | 0 | 0 | 0 | 0 | 0 | 0 | 0 | | empty | x | x | 5 |
| 7 | 5 | 9 | 0 | 1 | 2 | 5 | 0 | 0 | 0 | 0 | 0 | 0 | | empty | x | x | 9 |
| 8 | 6 | 15 | 0 | 1 | 2 | 5 | 9 | 0 | 0 | 0 | 0 | 0 | | empty | x | x | 15 |
| 9 | 7 | 17 | 0 | 1 | 2 | 5 | 9 | 15 | 0 | 0 | 0 | 0 | | 5 | 1 | 17 | |
| 10 | 8 | 18 | 0 | 1 | 2 | 5 | 9 | 15 | 0 | 0 | 0 | 0 | | empty | x | x | 17 |
| 11 | 8 | 18 | 0 | 1 | 2 | 5 | 9 | 15 | 17 | 0 | 0 | 0 | | 6 | 1 | 18 | |
| 12 | 9 | 18 | 0 | 1 | 2 | 5 | 9 | 15 | 17 | 0 | 0 | 0 | | empty | x | x | 18 |
| 13 | 9 | 18 | 0 | 1 | 2 | 5 | 9 | 15 | 17 | 18 | 0 | 0 | | 6 7 | 1 | 18 | |
| 14 | 10 | 19 | 0 | 1 | 2 | 5 | 9 | 15 | 17 | 18 | 0 | 0 | | 6 | 2 | 18 | |
| 15 | 11 | 18 | 0 | 1 | 2 | 5 | 9 | 15 | 17 | 18 | 0 | 0 | | empty | x | x | (6,2) |
| 16 | 11 | 18 | 0 | 1 | 2 | 5 | 9 | 15 | 17 | 18 | 17 | 18 | 0 | 6 7 8 9 | 1 | 18 | |
| 17 | 12 | 17 | 0 | 1 | 2 | 5 | 9 | 15 | 17 | 18 | 17 | 18 | 0 | 6 7 8 | 2 | 18 | |
| 18 | 13 | 15 | 0 | 1 | 2 | 5 | 9 | 15 | 17 | 18 | 17 | 18 | 0 | 6 | 3 | 18 | |
| 19 | 14 | 11 | 0 | 1 | 2 | 5 | 9 | 15 | 17 | 18 | 17 | 18 | 0 | empty | x | x | (6,3) |
| 20 | 14 | 11 | 0 1 2 5 9 15 17 18 17 18 17 18 17 | | | | | | | | | | | 4 | 1 | 11 | |
| 21 | 15 | 6 | 0 1 2 5 9 15 17 18 17 18 17 18 17 | | | | | | | | | | | empty | x | x | 11 |
| 22 | 15 | 6 | 0 1 2 5 9 15 17 18 17 18 17 18 17 11 | | | | | | | | | | | 3 | 1 | 6 | |
| 23 | 16 | 3 | 0 1 2 5 9 15 17 18 17 18 17 18 17 11 | | | | | | | | | | | empty | x | x | 6 |
| 24 | 16 | 3 | 0 1 2 5 9 15 17 18 17 18 17 18 17 11 6 | | | | | | | | | | | 1 2 3 | 1 | 3 | |

Fig. 5

procedure DeCompress:

```
1    clear the Second HistoryBuffer (154) to empty;
2    while there is data remaining to be read from the transfer medium do
3        begin
4            if the next input item is a (position,Matchlength) pair do
5                begin
6                    read the pair (p,MatchLength) from the transfer medium;
7                    for j := each integer from 1 to MatchLength do
8                        begin
9                            output the value at position p+j-1 in the Second
10                               HistoryBuffer;
11                           append the value just output to the Second HistoryBuffer
12                       end
13               end
14           else { Comment: the next input item is a single value };
15               begin
16                   read the single value, Value, from the transfer medium;
17                   output Value;
18                   append Value to the Second HistoryBuffer
19               end
20       end
```

Fig. 6

DATA COMPRESSION METHOD AND APPARATUS FOR WAVEFORMS HAVING RECURRING FEATURES

BACKGROUND OF THE INVENTION

This invention relates to a method and apparatus for data compression and more generally relates to a system in which data is compressed and decompressed.

Various data compression techniques are known in the art. Some techniques are described as lossless because the compressed form of the data can be expanded to a perfect duplicate of the original data. Other techniques, however, are described as lossy because the reconstructed data may differ slightly from the original data.

Lossless data compression techniques are typically used for textual computer files, such as documents composed in English, and for files that may be executed as computer programs, because the smallest deviation in such a file can lead to unpredictable results when the program is executed. Lossy techniques are typically used for digitized data, such as digitized photographic images or digitized sound, where small deviations can go unnoticed by a human observer. By permitting some degree of loss in the reconstructed data, a much higher degree of compression is normally achieved.

Many commercial software products employ lossless compression techniques based on a data compression technique described by Jacob Ziv and Abraham Lempel in the IEEE Transactions on Information Theory, Vol. IT-23, No. 3, May 1977. U.S. Pat. No. 4,701,745, issued Oct. 20, 1987 to Waterworth and U.S. Pat. No. 5,016,009, issued May 14, 1991 to Whiting disclose efficient implementations of this technique for use as computer programs. Basically, the Ziv-Lempel technique operates by maintaining a history buffer used to hold a copy of the most recently processed data and by searching the history buffer to locate repetitions of data. Such repetitions are encoded and provided as compressed output data.

It would be possible to apply a lossless data compression technique such as the aforesaid Ziv-Lempel technique to, for example, a digitized electrocardiogram (ECG) waveform, however, very little compression would be produced because exact repetitions of data would seldom be found. Electrocardiogram signals generally have a recurring shape but, their amplitude may vary slightly over time, within tolerances, and noise accompanying such signals could cause amplitude distortion. Generally any data that has been obtained from an analogue source and then digitized, such as that obtained in digitizing ECG signals, necessarily contains a noise component. Some signal noise is inherent in every analogue recording device and further noise may be introduced by the digitization process. Variations in amplitude and the presence of noise implies that exact repetitions of sequences of data values are unlikely to occur. Consequently, compression of data obtained from analogue sources, in particular ECG data, cannot be effectively compressed using known Ziv-Lempel techniques, which rely on exact repetitions of data values in the history buffer.

For some applications it may be desirable to modify the Ziv-Lempel technique to enable lossy compression of data from analog sources, by allowing for minor variances in signal amplitude.

SUMMARY OF THE INVENTION

According to one aspect of the invention there is provided an apparatus and method for compressing an input sequence of data items produced by sampling a periodic waveform, by searching a history buffer operable to store consecutive data items, to locate a stored sequence of consecutive data items matching the input sequence, where matching is deemed to occur when each data item in the input sequence is within non-equal upper and lower limits of its corresponding data item in the stored sequence. When a stored sequence matching the input sequence is located compressed output data is produced to represent the stored sequence and the stored sequence is again stored in the history buffer to succeed the data items already stored therein. When a stored sequence matching the input sequence is not located, a representation of the first data item in the input sequence is produced and the first data item is stored in the history buffer to succeed the data items already stored therein.

Preferably, the method includes, for each input data item in the input sequence, reading a plurality of storage locations in the history buffer until a stored data item matching the input data item is located and maintaining a matching positions list of each history buffer storage location which contains input data values matching a current data item. And, for each location identified in the matching positions list comparing a next input data item in the input sequence with the contents of the next data item in the stored sequence starting at each location identified in the Matching Positions List and removing from the matching positions list all history buffer storage locations for which the next input data item is not within the non-equal upper and lower limits of the data item in the stored sequence.

Preferably, the method includes the step of determining the length of a longest stored sequence of data items which matches the input sequence, the compressed output data representing the longest stored sequence and for each data item in the input sequence, incrementing a Match Length Counter each time the next input data item is within the non-equal upper and lower limits of the data item in the stored sequence, the Match Length Counter having a value representing the length of the longest stored sequence.

Preferably, the output data representing the stored sequence includes position data identifying the position of the stored sequence in the history buffer and length data identifying the length of the stored sequence and preferably the position data includes a code representing a history buffer storage location identifying the beginning of the stored sequence.

Optionally, the method includes the step of varying at least one of the upper and lower limits such that data items are more closely matched over pre-defined portions of the periodic waveform.

Preferably, the apparatus includes processing means including a central processing unit including a microprocessor and preferably, the history buffer includes Random Access Memory.

According to another aspect of the invention there is provided a system and method for handling input sequences of data derived from an analog source by compressing the input sequences according to the method described above, presenting compressed output data produced by the method described above to a transfer medium and by decompressing the compressed output data by retrieving data from the transfer medium and, when compressed output data is retrieved, locating the stored sequence in a Second History Buffer operable to store sequences of data items and providing to an output medium the stored sequence. The system then stores the stored sequence in the Second History Buffer to succeed the data items already in the Second History Buffer. When a representation of a single data item is retrieved, the system provides to the output medium a copy of the single data item and stores that data item in the Second History Buffer to succeed the data items already stored therein.

Generally, the apparatus and method for compression of data, according to the present invention, does not require exact matches of data sequences previously stored in the history buffer in order to effect compression, rather, the invention permits non-exact matching of previously stored data sequences, within upper and lower limits. Effectively, so long as every value in an input sequence of data matches the corresponding value in a previously stored sequence, to within this pre-defined "tolerance" range, a match is considered to have occurred and compression can take place.

By varying the pre-defined tolerance for matching, unimportant areas of a sampled waveform can be loosely matched within a wide tolerance to improve compression efficiency at the expense of fidelity, while important areas of the waveform can be more closely matched to preserve the fidelity of the data at the expense of compression efficiency.

BRIEF DESCRIPTION OF THE DRAWINGS

In drawings which illustrate embodiments of the invention,

FIG. 2(a) is a pseudo code listing of a first portion of a compression algorithm according to the invention;

FIG. 2(b) is a pseudo code listing of a second portion of the compression algorithm;

FIG. 5 is a Register/History Buffer table illustrating a plurality of iterations of a repeated portion of the compression algorithm of FIGS. 2(a) and 2(b); and FIG. 6 is a pseudo code listing of a decompression algorithm according to a first embodiment of the invention.

DETAILED DESCRIPTION

Figure 1:
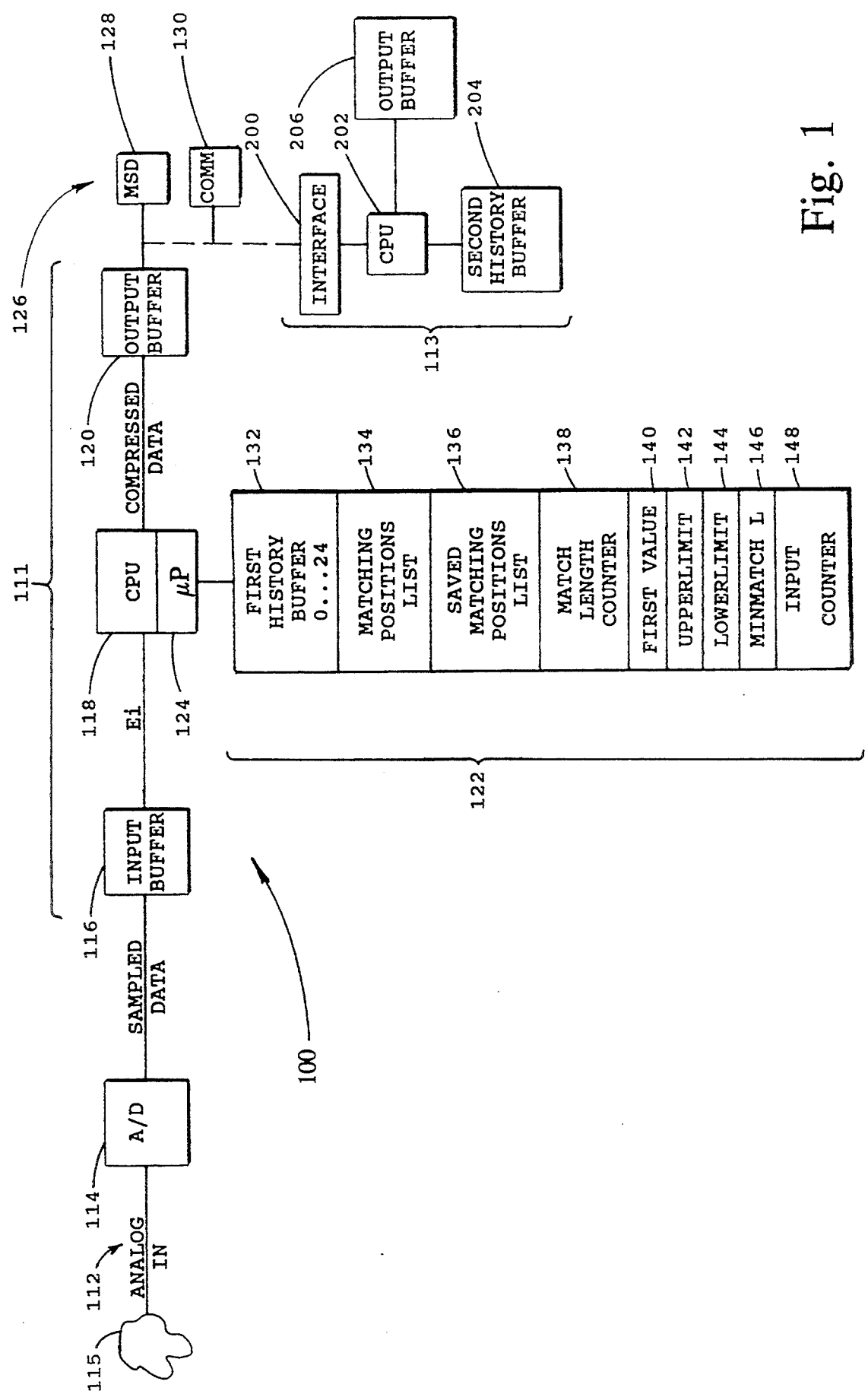
FIG. 1 is a block diagram of a data sequence compression apparatus according to a first embodiment of the invention.

Referring to FIG. 1, an apparatus for handling data, according to a first embodiment of the invention is shown generally at 100. The apparatus includes compression components shown generally at 111, transfer media shown generally at 126, and decompression components shown generally at 113. In this embodiment, the transfer media 126 may include a mass storage device 128 or a communications channel 130, for example.

In this embodiment, an electrocardiogram (ECG) unit 115 acts as an analog source which produces an analog electrocardiogram signal 112 derived by employing conventional techniques for acquiring such signals. An example of such a signal is shown at 154 in FIG. 3. Electrocardiogram signals generally have a periodic waveform and hence have many portions which are generally repeated in time. Consequently such signals are effectively compressed by the compression components of the apparatus.

Figures 3, 4:
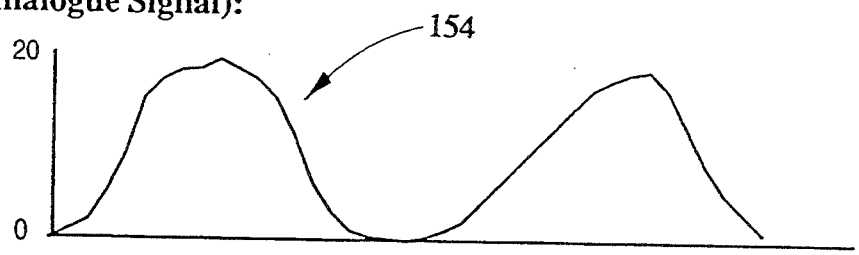
FIG. 3 is a diagram illustrating a representative ECG waveform operable to be compressed by the apparatus of FIG. 1.
FIG. 4 is a listing of digital data samples stored in an Input Buffer of the apparatus of FIG. 1, produced by sampling the waveform of FIG. 3.

The analog electrocardiogram signal 112 is applied to an analog-to-digital converter 114 operable to convert the signal into a succession of data items representing samples of the analog signal, as shown in FIG. 4. The analog signal may include some noise, however.

Preferably, the analog-to-digital converter 114 samples the analog ECG signal at a sampling frequency such that a plurality of successive data items are acquired during each period of the analog signal waveform.

Referring back to FIG. 1, the compression components 111 include an Input Buffer 116 operable to store the sampled data produced by the analog-to-digital converter 114. The Input Buffer is implemented using addressable Random Access Memory (RAM) (not shown), operable to receive and store data items provided by the analog-to-digital converter and to allow any data item stored during a timespan of one period of the input waveform to be selectively accessed.

The compression components 111 further include a central processing unit (CPU) 118, which, in this embodiment includes a microprocessor 124, an output buffer 120, and a random access memory (RAM) designated generally at 122. The CPU is operable to selectively address and retrieve any data item residing in the Input Buffer 116 and presents compressed output data to the output buffer 120 which presents such output data to the transfer media 126.

Data Compression Algorithm

Referring to FIGS. 1, 2(a) and 2(b), the CPU is controlled by instructions following a data compression algorithm according to the invention, shown in FIGS. 2(a) and 2(b). In order to execute the compression algorithm, further instructions are provided in the conventional manner to divide the RAM 122 into pre-defined areas to implement a First History Buffer 132, a Matching Positions List 134, a Saved Matching Positions List 136, a Match Length Counter 138, a First Value Register 140, Upper and Lower Limit Registers 142 and 144, a Minimum Match Length Register 146 and an Input Counter 148.

First History Buffer

The First History Buffer 132 is arranged to include a plurality of storage locations operable to store consecutive data items produced by the compression algorithm, in stored sequences. Preferably, the First History Buffer has enough storage locations to simultaneously store all data samples N taken during one period of the ECG waveform. In this example, the First History Buffer 132 has twenty-five storage locations identified as 0 through 24. When the First History Buffer 132 becomes full and a single new data value must be added to it, the contents of position 0 are lost, while the contents of each of the remaining positions are shifted down one position. A single new data value is entered in position 24. Similarly, if a new sequence of data items is to be added to the First History Buffer 132, each data item already stored in the First History Buffer is moved down by the number of data items in the new sequence and the new sequence is sequentially added to the last positions therein. While, for explanatory purposes there has been described a history buffer having 25 storage locations, preferably, the waveform will be sampled several hundred times per cycle and the First History Buffer will correspondingly hold hundreds of storage locations.

The Matching Positions List 134 and Saved Matching Positions List 136 have dynamically changing lengths while the First Value Register 140, Upper and Lower Limit Registers 142 and 144, Minimum Match Length Register 146 and Input Counter 148 have fixed lengths. The contents of the First Value Register 140 and the Input Counter 148 are updated by the compression algorithm. The Upper and Lower Limit Register contents and the Minimum Match Length Register contents are fixed in this embodiment.

Referring to FIGS. 2(a) and 2(b), the data compression algorithm includes first and second portions 150 and 152 expressed in pseudocode, generally following Algol 60 rules. The first portion 50 is comprised of lines 1 through 23, while the second portion 52 is comprised of lines 24 through 64.

The first portion 50 begins with line 1 which causes the CPU to clear the Matching Positions List 134 and the First History Buffer 132. Line 2 sets the Input Counter 148 to 1 and lines 3 through 59 describe a repeated portion which is repeated until all data from the Input Buffer 116 of FIG. 1 has been processed.

Referring back to FIG. 2(a), line 4 retrieves the present input ECG data item Ei from the Input Buffer 116 and line 6 causes processing to branch to first or second paths, depending upon whether or not the Matching Positions List is empty. The first path is identified by lines 7 through 23 in FIG. 2(a) and the second path is identified by lines 24 through 56 in FIG. 2(b).

Referring back to FIG. 2(a), the Matching Positions List 134 is empty, lines 7 through 10 direct the CPU 118 to read the contents of the First History Buffer 132 to locate all storage locations having a stored data item which approximately matches the present input data item Ei and to create a list of all of these positions as the Matching Positions List 134 shown in FIG. 1. A data item in the First History Buffer 132 is deemed to approximately match the present input data item when the stored data item to which it is compared is within Upper and Lower Limit Values of the input data item, the Upper and Lower Limit Values being contained in the Upper and Lower Limit Registers 142 and 144 shown in FIG. 1. In this embodiment, the Lower Limit is $-2$ while the Upper Limit is $+2$.

Entries in the Matching Positions List are deemed to identify respective starting locations of possible sequences in the First History Buffer which are most likely to match the expected input data items to follow. Once a match of an input data item with a First History Buffer data item has been found, the following successive input data items are considered to form part of an input data sequence starting with the present input data item. In effect therefore, lines 7–10 and the CPU act as reading means for reading a plurality of storage locations in the First History Buffer until a stored data item approximately matching the input data item is located. These components also act as searching means for searching the First History Buffer to locate a stored sequence of consecutive data items approximately matching the input sequence, while the same components act as maintaining means for maintaining a Matching Positions List of each history buffer storage location which contains a stored data item matching the first data item in the input sequence.

If no storage locations of the First History Buffer 132 contain data items which approximately match the first data item in the input sequence, the Matching Positions List is empty and no possible matching sequences are deemed to have been found in the First History Buffer. Lines 2 through 17 then direct the CPU to cause the present input data item to be provided as uncompressed output data to the transfer media 126 and cause the present data item to be stored in the First History Buffer 132 to succeed data items, if any, already stored therein. Therefore, lines 2–17, the microprocessor, and the First History Buffer act as data output producing means for producing a representation of the present data item when a stored sequence approximately matching the input sequence cannot be located. These components further act as storing means for storing the first data item in the First History Buffer to succeed the data items already stored therein.

If at least one storage location in the First History Buffer 132 contains a data item which approximately matches the present data item, Lines 19 through 22 direct the CPU to cause the First Value Register 140 of FIG. 1 to be loaded with the present data item and cause the Match Length Counter 138 of FIG. 1 to be loaded with the value 1 to indicate that a stored data sequence having a length of one data item, and beginning at the corresponding storage location in the First History Buffer 132 has been found. Processing then proceeds at line 58 in FIG. 2(b) which increments the Input Counter 148 causing the repeated portion beginning at line 3 in FIG. 2(a) to consider the next successive input data item.

While considering the next successive input data item, if the test at line 6 determines that the Matching Positions List 134 is not empty, then referring to FIG. 2(b), lines 25 through 57 are invoked. In this portion of the algorithm, line 26 causes the CPU to store a copy of the Matching Positions List 134 in the Saved Matching Positions List 136. Then, a loop defined between lines 28 and 31, is repeated for each starting location identified in the Matching Positions List 134. In the loop, line 28 determines whether or not this next successive input data item approximately matches stored data items stored at locations in the First History Buffer 132 immediately succeeding the starting locations identified in the Matching Positions List 134.

In effect, the next successive input data item in the input sequence is compared with corresponding next successive data items in respective stored sequences beginning at respective starting locations listed in the Matching Positions List. When a successive data item which does not match its corresponding data item in a stored sequence in the First History Buffer is found, the related starting location is removed from the Matching Positions List thereby shortening list. Lines 28 through 31, in conjunction with the CPU effectively act as comparing means for comparing a next input data item in the input sequence with the contents of the next data item in a stored sequence starting at a location defined by the Matching Positions List and act as removing means for removing from the Matching Positions List all history buffer storage locations for which such next input data item is not within the non-equal upper and lower limits of the data item in the stored sequence.

Once all of the possible stored sequences starting at the starting locations listed in the Matching Positions List have been tested in the loop, processing continues at line 28 which increments the Match Length Counter 138 such that the second successive data item in the input sequence is tested against the second successive data items in the stored sequences beginning at the start locations given by the Matching Positions List. In effect therefore, line 28, and the CPU act as incrementing means for incrementing the Match Length Counter each time another input data item is within the non-equal upper and lower limits of the corresponding data item in the stored sequence, the Match Length Counter ultimately having a value representing the length of the longest stored sequence.

The process of incrementing the Match Length Counter and testing successive input data items is continued until the Matching Positions List is empty at which time line 35 determines whether or not the contents of the Match Length Counter 138 are less than the minimum Match Length Value stored in the Minimum Match Length Register 146. This process of comparing successive input data items against corresponding successive data items in sequences stored in the First History Buffer acts as determining means for determining the length of a longest stored sequence of data items which matches the input sequence.

If the Match Length Counter contents are less than 2 in this embodiment, the stored sequence matching the input sequence contains fewer than two data items and the sequence is not compressed. Therefore, the present data item is retrieved from the First Value Register 140 and is presented to the transfer media 126 as output. This data item is then copied to the First History Buffer 132 to succeed data items already stored there. Line 41 then decrements the Input Counter 148 by the value contained in the Match Length Counter in order to cause processing to resume with the next data item immediately following the present data item. Processing then proceeds at line 58 which increments the Input Counter to cause the next input data item to be processed.

If, at line 35, the contents of the Match Length Counter 138 are greater than or equal to the contents of the Minimum Match Length Register 146 then, the input sequence is worth compressing and lines 44 through 54 become active.

Lines 45 through 47 direct the CPU to select a storage location from the last Saved Matching Positions List 131 and supply to the transfer media compressed output data representing the stored sequence associated therewith. The compressed data item includes position data identifying the position of the stored sequence in the First History Buffer and length data identifying the length of the stored sequence. In this embodiment, the position data includes a code representing the First History Buffer storage location which identifies the beginning of the stored sequence matching the input sequence. Hence, lines 45–47, the CPU and the First History Buffer act as compressed output producing means for producing compressed output data representing the stored sequence when a stored sequence matching the input sequence is located.

In addition, when a stored sequence matching the input sequence is located, lines 48 through 52 direct the CPU to cause each data item in the sequence identified by the compressed output data to be copied to the First History Buffer 132 to succeed the data items already in the First History Buffer. Hence these lines, the CPU and the First History Buffer act as storing means for storing the stored sequence represented by the compressed output data item, in the First History Buffer to succeed the data items already stored, therein.

Line 53 decrements the Input Counter 148 to cause processing to resume with the last input data item for which no match was found. Processing then proceeds with line 58 which increments the Input Counter 148 to cause the next successive input data item to be received.

Lines 60 through 64 direct the microprocessor to terminate the algorithm in the event that no more input data is provided during testing of the sequence within the First History Buffer and generally present to the transfer media compressed output data representing any stored sequence matching the final data sequence.

Operation

Referring to FIG. 3, an analogue ECG waveform is shown generally at 154. Referring to FIG. 4, data items obtained by sampling the waveform 154 of FIG. 3 are listed in the chronological order in which they were obtained.

Referring to FIG. 5, a Register/History Buffer table is shown generally at 156. The table includes a plurality of columns, including an Input Counter column 158, a Present Data Item column 160, a History Buffer column 162, a Matching Positions List column 164, a Match Length column 166, a First Value column 168 and an output column 170. Each row of the table 156 corresponds to one iteration of the repeat loop defined between lines 3 and 59 in FIGS. 2(a) and 2(b).

Referring to FIGS. 1 and 5, the Input Counter column 158 contains values representing the contents of the Input Counter 148 and the present data item Ei column 160 contains data values received from the Input Buffer 116 of FIG. 1. The First History Buffer column 162 represents the contents of the First History Buffer 132 as it exists just before commencing the iteration of the repeat loop, and the first nine storage locations or, positions are indicated at the top of the column. The Matching Positions List column 164 represents the contents of the Matching Positions List 134 as it exists immediately after an iteration of the repeat loop. The Match Length column 166 represents the contents of the Match Length Counter 138 and the First Value column 168 represents the contents of the First Value Register 140, immediately after the repeat loop iteration. The output column 170 represents the output produced by the iteration of the loop and includes both compressed and uncompressed output data.

Referring to FIGS. 1, 2(a), 2(b) and 5, the first ten iterations of the algorithm are represented by the first ten rows indicated by numerical reference 172. During the first ten iterations, no sequences in the First History Buffer 132, having a Match Length greater than 2 can be found, and, therefore, no compressed data output is produced. Rather, only copies of the input data items are presented as output.

During the next five iterations identified by numerical reference 174, a stored sequence of Match Length 2 is located at position 6 of the First History Buffer and the data pair (6,2) is provided in the Output column, where the 6 represents the starting position of the sequence and the 2 represents the length of the sequence.

Production of Uncompressed Output Data

Row 9

Referring to row 9 of the table, corresponding to the ninth iteration of the loop, the Input Counter contains the value 7 (not shown) and therefore the seventh input data item having a value of 17 is received. At line 6 of the first portion 150 of the algorithm shown in FIG. 2(a), the Matching Positions List 134 is empty and lines 7-10 find that position 5 of the First History Buffer contains the value 15 which approximately matches the value of 17, the input value. Consequently, the 5 is placed in the matching positions list as shown in the Matching Positions List column 164. The Matching Positions List is no longer empty in which case lines 19-22 of FIG. 2(a) cause the present input data item, 17, to be placed in the First Value Register 140 while the Match Length Counter 138 is loaded with the value 1 as seen in the First Value and match length columns 168 and 166 respectively.

The first portion 150 of the algorithm is thus completed and processing continues at line 58 which causes the Input Counter to be incremented to the value 8.

Row 10

The tenth iteration of the repeat loop is begun at this point as seen at row 10 in FIG. 5. The eighth input data item is obtained from the Input Buffer and has an value Ei of 18. Processing then proceeds with line 6 which determines that the Matching Positions List is not empty because it contains the value 5 from the previous iteration and therefore the second portion 152 of the algorithm shown in FIG. 2(b) is invoked. Lines 28-31 then compare the current input value 18 with the contents of the sixth location in the First History Buffer which, at this time, contains the value 0. In other words, the contents of the position identified by [the value contained in the Matching Positions List (6)+the value contained in the Match Length Counter (1) (6+1=7)] is compared with the current input data item. Clearly, the 0 does not approximately match the current input value of 18 and therefore the 5 is removed from the Matching Positions List. The Matching Positions List is now empty.

With the Matching Positions List empty, line 35 of FIG. 2(b) determines that the Match Length Counter contents having a value of 1, are less than the minimum match length of 2 and therefore lines 37-40 of FIG. 2(b) cause the 17 (the seventh input data item, previously stored i the First Value Register from row 9, to appear as output as seen in the output column 170. The 17 represents uncompressed output data produced by the algorithm. The value 17 is then added to the next position, position 6, of the First History Buffer. Lines 41 and 58 of FIG. 2(b) then cause the Input Counter contents to remain at the value 8 and processing continues at line 4 of FIG. 2(a).

Row 11

At line 4, an eleventh iteration of the algorithm begins as seen at row 11 of the table. This iteration involves the first portion of the algorithm seen in FIG. 2(a) and results in the Matching Positions List being loaded with the value 6, the Match Length Counter contents set to 1, the First Value Register 140 set at 18 and no output being produced on this iteration. When this iteration is completed, the Input Counter value is 9.

Row 12

At row 12 of the table, the ninth input data item, having the value 18 is retrieved from the Input Buffer 116. The Matching Positions List 134 contains the value 6 and therefore the contents of the seventh position are compared with the current input value. The seventh position contains the value 0 which does not approximately match the current input value 18 and therefore the value 18 is produced as output as seen in the output column 170 and the value 18 is added to the first history buffer at the next successive position, position 7. Lines 41 and 58 of FIG. 2(b) then cause the Input Counter contents to remain at the value 9 and processing continues at line 4 of FIG. 2(a).

Row 13

The thirteenth iteration is represented by row 13 at which lines 7-10 find that positions 6 and 7 of the First History Buffer contain data values which approximately match the ninth input data item, 18. Consequently the values 6 and 7 are copied to the Matching Positions List 134 as seen in the Matching Positions List column 164. At this point the Matching Positions List is not empty, therefore lines 19-22 cause the First Value Register 140 to be set to the ninth input data value, 18 and cause the Match Length Counter 138 to be set to 1. Line 58 of FIG. 2(b) then increments the Input Counter to cause the tenth input data item to be compared.

Row 14

Row 14 represents the fourteenth iteration where the tenth input data item, 19 is compared. At line 6 the Matching Positions List is found not empty, causing processing to branch to the second portion 152 of the algorithm seen in FIG. 2(b). Lines 28-31 first find that position 6 is listed in the Matching Positions List 134 and then compare the contents of position 7 (6+1) with the current data value, 19 and find that the contents of the seventh position are 18, which approximately matches the current input data value of 19. At this point line 33 causes nothing further to be done with this comparison and processing continues back at lines 28-31. These lines next find that position 7 is listed in the Matching Positions List and then compare the contents of position 8 (7+1) with the current data value 19. Position 8 contains the value 0 while the input data item has the value 19. Clearly, these data values do not approximately match and therefore, position 7 is removed from the Matching Positions List 134 as seen in column 164. At this point the Matching Positions List is not empty so processing continues at line 56 of FIG. 2(b) which increments the Match Length Counter to the value 2 as seen in column 166. The Input Counter 148 is then incremented at line 58 to the value 11.

Row 15

On the fifteenth iteration, the eleventh input data item is retrieved from the Input Buffer and line 6 of FIG. 2(a) determines that the Matching Positions List is not empty as it contains the value 6. Consequently, processing continues at line 25. Lines 28-31 then determine that position 6 is on the Matching Positions List and therefore the contents of position 8 (6+a match length of 2) are compared with the current data value of 18. The contents of position 8 are 0 while the value of the eleventh input data item is 18. Clearly, these values do not approximately match, in which case the 6 is removed from the Matching Positions List 134 and the Matching Positions List is rendered empty as seen in the Matching Positions List column 164. With the Matching Positions List 134 now empty, line 35 determines that the Match Length Counter contains the value 2 which is not less than the Minimum Match Length Register contents of 2 and therefore lines 44–53 are invoked. Lines 44–53 locate the value 6 from the Saved Matching Positions List (created at line 26) and cause this value to appear as the first number of a number pair and cause the contents of the match length register to appear as the second number of the number pair, the number pair representing the starting position of a stored sequence in the First History Buffer which approximately matches an input data sequence beginning with the seventh data item (17) in the input sequence of data and continuing for two data items to end with the ninth data item (18). The number pair thus represents compressed data produced by the apparatus. Lines 48–52 cause the actual data values (17 and 18) in this sequence to be copied to the First History Buffer 132 as seen in row 16 of the table. Lines 52 and 58 then cooperate to keep the Input Counter 148 constant, in this case at the value 11 and the sixteenth iteration is ready to proceed.

The next four iterations of the algorithm represented by rows 16 to 19, result in compressed output consisting of the number pair (6,3) to be produced in a manner similar to that described above. The remainder of the entries in the table are produced in a manner similar to that described above.

The data values presented in the output column may be suitably encoded for compatibility with the transfer media, in accordance with any of the known methods of encoding digital data.

Decompression

Referring back to FIG. 1, decompression of the compressed output data produced by the compression components 111 is performed by the decompression components 113. The decompression components include an interface 200, a second CPU 202 including a second microprocessor (not shown), a Second History Buffer 204 and a second output buffer 206, all of which act as decompressing means for decompressing compressed data from the transfer medium.

The interface 200 is used to connect the CPU 202 to the transfer media 126 to permit output data from the transfer media to be read by the CPU. The Second History Buffer 204 is similar to the First History Buffer 132 in that it is operable to store successive sequences of data items and it must contain the same number of storage locations as the First History Buffer 132 for decompression to be performed successfully. The second output buffer 206 serves to provide decompressed output data to further output transfer media (not shown).

The CPU 202 executes instructions according to a decompression algorithm shown generally at 208 in FIG. 6 and includes a plurality of lines identified as lines 1–20 When a compressed output data item representing a stored sequence is received from the transfer media, the stored sequence is located in the Second History Buffer 204 at a storage location defined by the position data contained in the compressed data. The stored sequence is then presented to the output transfer media by copying from the Second History Buffer each data item in the stored sequence beginning at the location identified by the position data and continuing to a location defined by the start position plus the match length data. Each output data item in the stored sequence is then re-copied to the Second History Buffer 204 by storing such data items of the stored sequence in the Second History Buffer to succeed the data items already stored therein. This is accomplished by lines 3–13, therefore, these lines and the second CPU 202 act as retrieving means for retrieving data from the transfer media 126, locating means for locating a stored sequence in the Second History Buffer when compressed output data representing a stored sequence is retrieved by the retrieving means, sequence output means for providing to an output medium the stored sequence and sequence storing means for storing the stored sequence in the Second History Buffer to succeed the data items already stored therein.

When a representation of an uncompressed data item is retrieved, such data item is provided directly to the output medium and is stored in the Second History Buffer to succeed the data items already stored therein. This is accomplished by lines 15–18 which in combination with the second CPU 202 and output buffer 206 act as data output means.

Alternatives

In an alternative embodiment, the decompression algorithm may be replaced by a conventional Ziv-Lempel decompression algorithm (not shown) otherwise used for decompressing Ziv-Lempel compressed data which has been compressed with exact matching. Consequently, an advantage of the compression technique disclosed herein is that the compressed data so produced may be decompressed using conventional decompression methods.

In another alternative embodiment, conventional digital filtering techniques may be employed on the sampled input data representing the ECG waveform in order to determine a synchronization point on the waveform, similar to establishing a trigger point with an oscilloscope on an analog waveform. Input data items associated with a given portion of the waveform may then be readily identified in the input data and when a particular portion of the waveform is required to be compressed with a high degree of fidelity, the upper and lower limits may be changed. For example, higher fidelity can be achieved by changing the upper and lower limits to $+1$ and $-1$ respectively. While fewer input sequences of data would be compressed, higher fidelity would be achieved over the fidelity achieved with the previously described limits of $+2$ and $-2$. Conversely, portions of the waveform which do not require high fidelity reproduction can be more loosely matched to the stored sequences by changing the upper and lower limits to $+3$ and $-3$ respectively to cause more input sequences to be compressed, at the expense of fidelity.

From the foregoing, it will be appreciated that the upper and lower limits need not be changed by the same amount. For example, the upper limit may be changed to $+4$ while the lower limit may be changed to $-1$ or perhaps the upper limit may be changed to $+1$ while the lower limit is changed to $-4$. The choice of upper and lower limits will depend upon the portion of the waveform of particular interest.

Changes to the upper and Lower Limit Registers can be made relatively easily by suitable programming of the CPU to change the contents of the upper and Lower Limit Registers when the Input Counter is within pre-defined ranges of values, representing pre-defined portions of the input waveform. Thus the CPU acts as means for varying the upper and lower limits such that data items are more closely matched over pre-defined portions of the periodic waveform.

It will be appreciated from the foregoing that the present invention provides a method of compressing data representing a periodic waveform and has a particular use in compressing ECG waveform data. Compression of such waveforms is achieved by permitting non-exact, approximate matching of input data with stored sequences of data. While specific embodiments of the invention have been described and illustrated, such embodiments should be considered illustrative of the invention only and not as limiting the invention as construed in accordance with the accompanying claims.

What is claimed is:

1. A method of compressing an input sequence of data items produced by sampling a periodic waveform, the method comprising the steps of:
   a) searching a First History Buffer operable to store consecutive data items, to locate a stored sequence of consecutive data items matching said input sequence, said matching occurring when each data item in said input sequence is within non-equal upper and lower limits of its corresponding data item in said stored sequence; and
   b) when a stored sequence matching said input sequence is located, producing compressed output data representing said stored sequence and storing said stored sequence in the First History Buffer to succeed the data items already in said First History Buffer; and
   c) when a stored sequence matching said input sequence is not located, producing uncompressed output data including a representation of the first data item in said input sequence and storing said first data item in the First History Buffer to succeed the data items already stored in said First History Buffer.

2. A method as claimed in claim 1 wherein the step of searching includes, for each input data item in said input sequence, reading a plurality of storage locations in the First History Buffer until a stored data item matching said input data item is located.

3. A method as claimed in claim 2 wherein the step of searching includes maintaining a matching positions list of each history buffer storage location which contains input data values matching a current data item.

4. A method as claimed in claim 3 further including the step of, for each location identified in said matching positions list:
   a) comparing a next input data item in said input sequence with the next data item in at least one stored sequence starting at said each location; and
   b) removing from said matching positions list all history buffer storage locations for which the next input data item value is not within said non-equal upper and lower limits of the data item value in said stored sequence.

5. A method as claimed in claim 1 further including the step of determining the length of a longest stored sequence of data items which matches said input sequence, said compressed output data representing said longest stored sequence.

6. A method as claimed in claim 5, wherein the step of determining includes the step of, for each data item in said input sequence, incrementing a Match Length Counter each time a further input data item is within said non-equal upper and lower limits of a corresponding data item in said stored sequence, said Match Length Counter having a value representing the length of said longest stored sequence.

7. A method, as claimed in 1, wherein the step of producing said compressed output data includes identifying the position of said stored sequence in said First History Buffer and identifying the length of said stored sequence.

8. A method, as claimed in claim 7, wherein the step of identifying the position of said stored sequence includes producing said a code representing a history buffer storage location identifying the beginning of said stored sequence.

9. A method as claimed in claim 1 further including the step of varying at least one of said upper and lower limits such that data items are more closely matched over pre-defined portions of said periodic waveform.

10. An apparatus for compressing an input sequence of data items produced by sampling a periodic waveform, the apparatus including:
   a) a First History Buffer operable to store consecutive data items in stored sequences;
   b) searching means for searching said First History Buffer to locate a stored sequence of consecutive data items matching said input sequence, said matching occurring when each data item in said input sequence is within non-equal upper and lower limits of its corresponding data item in said stored sequence;
   c) compressed output producing means for producing compressed output data representing said stored sequence when a stored sequence matching said input sequence is located;
   d) storing means for storing said stored sequence represented by said compressed output data, in the First History Buffer, to succeed the data items already in said First History Buffer;
   e) data output producing means for producing uncompressed output data including a representation of the first data item in said input sequence when a stored sequence matching said input sequence is not located; and
   f) storing means for storing said first data item in the First History Buffer to succeed the data items already stored in said First History Buffer.

11. An apparatus as claimed in claim 10 wherein said searching means includes reading means for reading a plurality of storage locations in the First History Buffer until a stored data item matching said input data item is located.

12. An apparatus as claimed in claim 1 wherein said searching means includes maintaining means for maintaining a matching positions list of each First History Buffer storage location which contains input data values matching a current data item.

13. An apparatus as claimed in claim 12 wherein said searching means includes comparing means for comparing a next input data item in said input sequence with the a next data item in at least one stored sequence starting at said each location.

14. An apparatus as claimed in claim 13 wherein said searching means includes removing means for removing from said matching positions list all First History Buffer storage locations for which the next input data item value is not within said non-equal upper and lower limits of the corresponding data item value in said stored sequence.

15. An apparatus as claimed in claim 10 further including determining means for determining the length of a longest stored sequence of data items which matches said input sequence, said compressed output data item representing said longest stored sequence.

16. An apparatus as claimed in claim 15 wherein said determining means includes a Match Length Counter and incrementing means for incrementing said Match Length Counter each time a further input data item is within said non-equal upper and lower limits of a corresponding data item in said stored sequence, said Match Length Counter having a value representing the length of said longest stored sequence.

17. An apparatus, as claimed in 10, wherein said compressed output data representing said stored sequence includes position data identifying the position of said stored sequence in said First History Buffer and length data identifying the length of said stored sequence.

18. An apparatus as claimed in claim 17, wherein said position data includes a code representing a First History Buffer storage location identifying the beginning of said stored sequence.

19. An apparatus as claimed in claim 10 further including varying means for varying at least one of said upper and lower limits such that data items are more closely matched over pre-defined portions of said periodic waveform.

20. An apparatus for compressing an input sequence of data items produced by sampling a periodic waveform, the apparatus including:
   a) a First History Buffer operable to store consecutive data items in stored sequences;
   b) processing means for:
      i) searching said First History Buffer to locate a stored sequence of consecutive data items matching said input sequence, said matching occurring when each data item in said input sequence is within non-equal upper and lower limits of its corresponding data item in said stored sequence; and
      ii) when a stored sequence matching said input sequence is located, producing compressed output data representing said stored sequence and storing said stored sequence in the First History Buffer to succeed the data items already in said First History Buffer; and
      iii) when a stored sequence matching said input sequence is not located, producing uncompressed output data including a representation of the first data item in said input sequence and storing said first data item in the First History Buffer to succeed the data items already stored in said First History Buffer.

21. An apparatus as claimed in claim 20 wherein said data processing means includes a central processing unit.

22. An apparatus as claimed in claim 21 wherein said central processing unit includes a microprocessor.

23. An apparatus as claimed in claim 20 wherein said First History Buffer includes Random Access Memory.

24. A method of handling input sequences of data derived from an analog source, the method comprising the steps of:
   a) compressing said input sequences by:
      i) searching a First History Buffer operable to store consecutive data items, to locate a stored sequence of consecutive data items matching said input sequence, said matching occurring when each data item in said input sequence is within non-equal upper and lower limits of its corresponding data item in said stored sequence; and
      ii) when a stored sequence matching said input sequence is located, presenting to a transfer medium compressed output data representing said stored sequence and storing said stored sequence in the First History Buffer to succeed the data items already in said First History Buffer; and
      iii) when a stored sequence matching said input sequence is not located, presenting to said transfer medium uncompressed output data including a representation of the first data item in said input sequence and storing said first data item in the First History Buffer to succeed the data items already stored in said First History Buffer; and
   b) decompressing said output data item by retrieving data from said transfer medium and:
      i) when compressed output data is retrieved locating the corresponding stored sequence in a Second History Buffer operable to store sequences of data items and providing to an output medium said stored sequence and storing said stored sequence in said Second History Buffer to succeed the data items already in said Second History Buffer; and
      ii) when uncompressed data is retrieved, providing to said output medium said first data item and storing said first data item in the Second History Buffer to succeed the data items already stored in said Second History Buffer.

25. A method as claimed in claim 24 wherein the step of searching includes, for each input data item in said input sequence, reading a plurality of storage locations in the First History Buffer until a stored data item matching said input data item is located.

26. A method as claimed in claim 25 wherein the step of searching includes maintaining a matching positions list of each First History Buffer storage location which contains input data values matching a current data item.

27. A method as claimed in claim 26 further including the step of, for each location identified in said matching positions list:
   a) comparing a next input data item in said input sequence with the next data item in at least one stored sequence starting at said each location; and
   b) removing from said matching positions list all First History Buffer storage locations for which the next input data item is not within said non-equal upper and lower limits of the corresponding data item in said stored sequence.

28. A method as claimed in claim 24 further including the step of determining the length of a longest stored sequence of data items which matches said input sequence, said compressed output data item representing said longest stored sequence.

29. A method as claimed in claim 28, wherein the step of determining includes the step of, for each data item in said input sequence, incrementing a Match Length Counter each time a further input data item is within said non-equal upper and lower limits of a corresponding data item in said stored sequence, said Match Length Counter having a value representing the length of said longest stored sequence.

30. A method, as claimed in 24, wherein the step of producing said compressed output data includes identifying the position of said stored sequence in said First History Buffer and identifying the length of said stored sequence.

31. A method, as claimed in claim 30, wherein the step of identifying the position of said stored sequence includes producing said a code representing a First History Buffer storage location identifying the beginning of said stored sequence.

32. A method as claimed in claim 24 further including the step of varying at least one of said upper and lower limits.

33. An apparatus for handling input sequences of data derived from an analog source, apparatus including:
 a) compressing means for compressing said sequences of data, said compressing means including:
  i) a First History Buffer operable to store consecutive data items in stored sequences;
  ii) searching means for searching said First History Buffer to locate a stored sequence of consecutive data items matching said input sequence, said matching occurring when each data item in said input sequence is within non-equal upper and lower limits of its corresponding data item in said stored sequence;
  iii) compressed output producing means for presenting to a transfer medium compressed output data representing said stored sequence when a stored sequence matching said input sequence is located;
  iv) storing means for storing said stored sequence represented by said compressed output data item, in the First History Buffer, to succeed the data items already in said First History Buffer;
  v) uncompressed data output producing means for applying to said transfer medium a representation of the first data item in said input sequence when a stored sequence matching said input sequence is not located; and
  vi) storing means for storing said first data item in the First History Buffer to succeed the data items already stored in said First History Buffer;
 b) decompressing means for decompressing data from said transfer medium, said decompressing means including;
  i) retrieving means for retrieving data from said transfer medium;
  ii) a Second History Buffer operable to store sequences of data items;
  iii) locating means for locating said stored sequence in a Second History Buffer when a compressed output data item representing said stored sequence is retrieved by said retrieving means;
  iv) sequence output means for providing to an output medium said stored sequence; and
  v) sequence storing means for storing said stored sequence in said Second History Buffer to succeed the data items already in said Second History Buffer; and
  vi) data output means for providing to said output medium said first data item when uncompressed data is retrieved by said retrieving means; and
  vii) data storing means for storing said uncompressed data item in the Second History Buffer to succeed the data items already stored in said Second History Buffer.

34. An apparatus as claimed in claim 33 wherein said searching means includes reading means for reading a plurality of storage locations in the First History Buffer until a stored data item matching said input data item is located.

35. An apparatus as claimed in claim 34 wherein said searching means includes maintaining means for maintaining a matching positions list of each First History Buffer storage location which contains input data values matching a current data item.

36. An apparatus as claimed in claim 35 wherein said searching means includes comparing means for comparing a next input data item in said input sequence with a next data item in at least one stored sequence starting at said each location.

37. An apparatus as claimed in claim 36 wherein said searching means includes removing means for removing from said matching positions list all First History Buffer storage locations for which the next input data item is not within said non-equal upper and lower limits of the data item in said stored sequence.

38. An apparatus as claimed in claim 33 further including determining means for determining the length of a longest stored sequence of data items which matches said input sequence, said compressed output data item representing said longest stored sequence.

39. An apparatus as claimed in claim 38 wherein said determining means includes a Match Length Counter and incrementing means for incrementing said Match Length Counter each time a further input data item is within said non-equal upper and lower limits of a corresponding data item in said stored sequence, said Match Length Counter having a value representing the length of said longest stored sequence.

40. An apparatus, as claimed in 33, wherein said output data item representing said stored sequence includes position data identifying the position of said stored sequence in said First History Buffer and length data identifying the length of said stored sequence.

41. An apparatus as claimed in claim 40, wherein said position data includes a code representing a First History Buffer storage location identifying the beginning of said stored sequence.

42. An apparatus as claimed in claim 33 further including varying means for varying at least one of said upper and lower limits.

43. An apparatus as claimed in claim 33 wherein said transfer medium includes a mass storage device.

44. An apparatus as claimed in claim 33 wherein said transfer medium includes a communications channel.

45. An apparatus as claimed in claim 33 wherein said input sequences include data samples of an analog waveform provided by said analog source.

46. An apparatus for handling input sequences of data derived from an analog source, the apparatus comprising:
 a) compressing means for compressing said input sequences said compressing means including first data processing means for:
  i) searching a First History Buffer operable to store consecutive data items, to locate a stored sequence of consecutive data items matching said input sequence, said matching occurring when each data item in said input sequence is within non-equal upper and lower limits of its corresponding data item in said stored sequence; and
  ii) when a stored sequence matching said input sequence is located, presenting to a transfer medium compressed output data representing said stored sequence and storing said stored sequence in the First History Buffer to succeed the data items already in said First History Buffer; and
  iii) when a stored sequence matching said input sequence is not located, presenting to said transfer media output a representation of the first data item in said input sequence and storing said first data item in the First History Buffer to succeed the data items already stored in said First History Buffer; and b) decompressing means for decompressing data from said transfer medium, said decompressing means including second data processing means for:

i) retrieving data from said transfer medium and:

i) when a compressed output data item representing said stored sequence is retrieved, locating said stored sequence in a Second History Buffer operable to store sequences of data items and providing to an output medium said stored sequence and storing said stored sequence in said Second History Buffer to succeed the data items already in said Second History Buffer; and ii) when uncompressed output data is retrieved, providing to said output media said uncompressed output data item and storing said uncompressed data item in the Second History Buffer to succeed the data items already stored in said Second History Buffer.

47. An apparatus as claimed in claim 46 wherein said first and second data processing means include first and second central processing units respectively.

48. An apparatus as claimed in claim 47 wherein said first and second central processing units includes first and second microprocessors respectively.

49. An apparatus as claimed in claim 46 wherein said first and second data processing means are implemented in the same central processing unit.

50. An apparatus as claimed in claim 49 wherein said central processing unit includes a microprocessor.

51. An apparatus as claimed in claim 46 wherein said transfer medium includes a mass storage device.

52. An apparatus as claimed in claim 46 wherein said transfer medium includes a communications channel.

53. An apparatus as claimed in claim 46 wherein said input sequences include data samples of an analog waveform provided by said analog source.

* * * * *